United States Patent
Aipperspach et al.

(10) Patent No.: US 6,643,804 B1
(45) Date of Patent: *Nov. 4, 2003

(54) STABILITY TEST FOR SILICON ON INSULATOR SRAM MEMORY CELLS UTILIZING BITLINE PRECHARGE STRESS OPERATIONS TO STRESS MEMORY CELLS UNDER TEST

(75) Inventors: Anthony Gus Aipperspach, Rochester, MN (US); Todd Alan Christensen, Rochester, MN (US); Douglas Michael Dewanz, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/552,410

(22) Filed: Apr. 19, 2000

(51) Int. Cl.$^7$ ................................................ G11C 29/00
(52) U.S. Cl. ........................ 714/718; 365/201; 365/203; 714/733
(58) Field of Search ................................ 714/718, 823, 714/816, 805, 720, 733, 734; 365/189.01, 201, 203–207, 230.01, 156, 230.02, 230.03, 226, 189.09, 185.03; 257/347–357

(56) References Cited

U.S. PATENT DOCUMENTS

| | | | | |
|---|---|---|---|---|
| 5,191,554 A | * | 3/1993 | Lee | 365/226 |
| 5,770,881 A | * | 6/1998 | Pelella et al. | 257/347 |
| 5,774,411 A | * | 6/1998 | Hsieh et al. | 365/230.06 |
| 6,128,219 A | * | 10/2000 | Pio et al. | 365/185.09 |
| 6,275,427 B1 | * | 8/2001 | Aipperspach et al. | 365/201 |
| 6,404,686 B1 | * | 6/2002 | Aipperspach et al. | 365/205 |

OTHER PUBLICATIONS

Morimura et al. 'A shared–bitline SRAM cell architecture for 1–V ultra low–power word–bit configurable macrocells; IEEE, pp. 12–17; Aug. 17, 1999.'*

* cited by examiner

Primary Examiner—Phung M. Chung
Assistant Examiner—Guy Lamarre
(74) Attorney, Agent, or Firm—Wood Herron & Evans LLP

(57) ABSTRACT

An apparatus, program product, and method of testing a silicon-on-insulator (SOI) static random access memory (SRAM) introduce switching history effects to a memory cell during testing to stress the memory cell such that a reliable determination of stability may be made. Stress is applied to a memory cell through the use of a bitline precharge stress operation, which utilizes the bitline pairs coupled to a memory cell to attempt to flood the memory cell with charge and thereby attempt to cause the memory cell to unexpectedly switch state. The bitline precharge stress operation is performed immediately after the memory cell has been switched to one state after being maintained in an opposite state for a length of time that is sufficient to introduce switching history effects to the memory cell. While a bitline precharge operation may be implemented separate from any write operation, the bitline precharge stress operation may also be incorporated into a write operation through delaying the deassertion of the wordline that occurs in a conventional write operation until after initiation of the bitline precharge operation that conventionally occurs near the end of such a write operation.

31 Claims, 4 Drawing Sheets

STABILITY TEST FOR SILICON ON INSULATOR SRAM MEMORY CELLS UTILIZING BITLINE PRECHARGE STRESS OPERATIONS TO STRESS MEMORY CELLS UNDER TEST

CROSS-REFERENCE TO RELATED APPLICATIONS

This application is related to U.S. patent application Ser. No 09/552,119, filed on even date herewith by Aipperspach et al., and entitled "Stability Test for Silicon on Insulator SRAM Memory Cells Utilizing Disturb Operations to Stress Memory Cells Under Test", now U.S. Pat. No. 6,275,427, which application is incorporated by reference herein.

FIELD OF THE INVENTION

The invention is generally related to testing solid-state memories, and in particular, to stability testing of silicon on insulator static random access memory cells and memory arrays incorporating the same.

BACKGROUND OF THE INVENTION

Solid-state memories, i.e., memories formed from arrays of memory cells disposed on integrated circuits, or chips, are utilized in a wide variety of applications to store data in computers and other electronic devices. One type of solid-state memory, for example, is static random access memory (SRAM), which due to its fast access time is often used in high performance applications such as cache memories coupled to computer processors. Often, SRAM memory arrays are embedded—that is, integrated with a computer processor and/or other logic on a single chip.

Due to processing variations during the manufacture of chips incorporating SRAM's or other solid-state memories, memory testing is often required during manufacture of the chips to identify defective chips that fall outside of desirable performance specifications. It is also often desirable to provide memory testing capabilities in electronic devices that incorporate such chips, e.g., using embedded built-in self-test (BIST) logic, to detect defects that may arise after manufacture and thereby ensure the continued reliability of data stored in the chips.

A number of performance characteristics are desirable for SRAM and other types of memory arrays. One such performance characteristic is stability, which generally refers to the ability of a memory cell in a memory array to maintain a given logic state after that logic state is written into the memory cell. Stability is often a critical performance metric for a memory cell, as an unstable memory cell may be susceptible to unexpectedly flipping logic states in certain circumstances, and thereby corrupting the data stored in the cell.

To provide a better understanding of the concept of stability, FIG. 1 illustrates a conventional SRAM memory cell 10 coupled between a wordline WL and pair of complementary bitlines BLC and BLT. Multiple wordlines and bitline pairs are typically provided in a memory array such that each memory cell in the array is coupled to a unique combination of wordlines and bitline pairs to permit each memory cell to be individually accessed in the array.

A conventional SRAM memory cell typically includes six metal oxide semiconductor field effect transistors (MOSFET's, or simply FET's), which are illustrated in FIG. 1 as FET's N1–N4 and P3–P4. FET's N1 and N2 are n-type MOSFET's that function as pass gates controlled by wordline WL. FET's N3 and P3 are respectively n-type and p-type FET's arranged to form an inverter, as are FET's N4 and P4. The inverters N3/P3 and N4/P4 are arranged in a cross-coupled configuration, with the output of one inverter coupled to the input of the other. Pass gate FET's N1 and N2 respectively couple the cross-coupled inverters to the BLC and BLT bitlines in response to the signal on wordline WL.

As shown in FIG. 2, data is written into an SRAM memory cell by precharging bitlines BLT, BLC to a predetermined level such as the high supply, turning off the bitline precharge devices, activating pass gates N1 and N2 by asserting wordline WL, and subsequently driving bitlines BLT and BLC to force the desired data on the bitlines. Subsequent to these operations, the internal nodes of the memory cell, illustrated at TRU and CMP (for "true" and "complementary" states) are switched to represent the appropriate state being written to the cell (e.g., a transition from a logic "1" to a logic "0" state in FIG. 2). Once the internal nodes have been switched to the proper state, pass gates N1 and N2 are shut off by deasserting wordline WL, and the bitline precharge devices are turned on to precharge the bitlines BLT and BLC to the high supply. The WRITE operation is then complete.

As shown in FIG. 3, a READ operation occurs by precharging bitlines BLT, BLC to the high supply, turning off the bitline precharge devices, activating pass gates N1 and N2 by asserting wordline WL, and then allowing the appropriate true or complement bitline BLT, BLC to be discharged depending upon the data stored in the cell (e.g., for FIG. 3, where a logic "1" state is stored in the cell, the BLC line is discharged). The state of the memory cell is then sensed by a sense amplifier coupled to the bitlines, and after sensing of the data, pass gates N1 and N2 are shut off by deasserting wordline WL, and the bitline precharge devices are again turned on to precharge the bitlines to the high supply.

Stability concerns arise in SRAM memory cells due to the relatively large capacitance of the bitlines BLT and BLC relative to the FET's in such memory cells. In particular, absent proper design and manufacture, the capacitance in the bitlines can flood from the bitlines during accesses to a memory array to switch the internal state of a memory cell, resulting in instability and unreliability of data. As shown in FIG. 3, for example, any attempt to read memory cell 10, or even any other memory cell controlled by the same wordline, results in the level at the CMP internal node rising from its zero logic state. If the CMP node rises high enough to activate the N3/P3 inverter, the cell will switch state, and thereby corrupt the data stored in the cell.

To address this difficulty, the relative sizes of pass gates N1 and N2 are typically designed relative to the pull down FET's N3 and N4 in the cross-coupled inverters to prevent charge from the bitlines from switching the internal state of the cell. However, it has been found that variations in cell widths, lengths, threshold voltages, and other manufacturing parameters can still cause instability in a memory cell, and thus memory testing is often required to ensure that manufactured components meet acceptable stability parameters.

Furthermore, certain fabrication technologies can be more susceptible to stability concerns than others. In particular, it has been found that SRAM's manufactured using silicon-on-insulator (SOI) technology may exhibit additional characteristics that impact memory stability beyond conventional bulk silicon technologies. With a conventional bulk silicon process, for example, SRAM memory cells are formed on a silicon substrate, which is typically tied to a fixed voltage level such as ground or high supply so that the bodies of the FET's are maintained at a fixed potential. With SOI technology, on the other hand, FET's are formed within an oxidized layer of insulation on a substrate that insulates the FET's from electrical effects, and permits the FET's to operate at a higher speed and with reduced power consumption. As a result, the bodies of the FET's are not tied to any fixed potential, and are thus allowed to "float" to different voltages based upon their respective switching histories.

As the body voltage of a FET changes, its characteristics, e.g., the threshold voltage required to activate the FET, also change. As such, it has been found that the switching history effect exhibited by SOI SRAM's may result in memory cells favoring one state over the other, with such favoritism typically increasing over time as a cell is maintained in the same state.

For example, FIG. 3 illustrates how the amount in which the complementary node CMP rises during a READ operation can vary depending upon switching history. In many instances, it has been found that the level in which the complementary node will rise in response to a READ operation is at a relatively low level, e.g., as represented at A in FIG. 3. However, it has also been found that, when a cell has remained in one state for a relatively long time, and thus favors that state, the cell typically has its greatest instability immediately after it is written to an opposite state, such that any READ to the memory cell or any other memory cell on the same wordline may cause the CMP node of such memory cell to rise even higher (e.g., as represented at B in FIG. 3)—potentially to a level that would switch the internal state of the memory cell.

Given that switching history does not appreciably modify the performance of memory cells formed using conventional bulk silicon processes (principally due to the fixed body potentials in the cells), conventional memory tests for bulk silicon processes do not address or accommodate for switching history effects. Accordingly, conventional memory tests are often incapable of adequately testing the potential reliability of SOI SRAM memory arrays.

Therefore, a significant need has arisen in the art for a manner of testing SOI SRAM memory cells and arrays incorporating the same so as to accommodate for switching history effects in a determination of the stability of such cells.

SUMMARY OF THE INVENTION

The invention addresses these and other problems associated with the prior art by providing an apparatus, program product, and method of testing a silicon-on-insulator (SOI) static random access memory (SRAM) in which switching history effects are introduced to a memory cell during testing to stress the memory cell such that a reliable determination of stability may be made. In particular, it has been found that the worst case scenario for memory cell stability typically occurs immediately after a memory cell is switched to one state after the memory cell has been maintained in the other, opposite state for a period of time sufficient to introduce switching history effects. As such, by configuring a testing process to maintain a memory cell in a particular state for a period of time sufficient to introduce switching history effects, the memory cell can be adequately stressed during the testing process to highlight any stability problems.

Consistent with the invention, stress is applied to a memory cell through the use of a bitline precharge stress operation, which utilizes the bitline pairs coupled to a memory cell to attempt to flood the memory cell with charge and thereby attempt to cause the memory cell to unexpectedly switch state. Typically, the bitline precharge stress operation is performed during the aforementioned worst case scenario—that is, immediately after the memory cell has been switched to one state after being maintained in an opposite state for a length of time. While a bitline precharge operation may be implemented separate from any write operation, in some embodiments, the bitline precharge stress operation may simply be incorporated into a write operation through delaying the deassertion of the wordline that occurs in a conventional write operation until after initiation of the bitline precharge operation that conventionally occurs near the end of such a write operation. By incorporating the bitline precharge operation into a write operation, often both operations may be performed in the same memory access cycle, thus shortening the time between switching the state of the memory cell and stressing the memory cell, and increasing the likelihood of encountering unexpected state changes in the memory cell.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Figure 4:
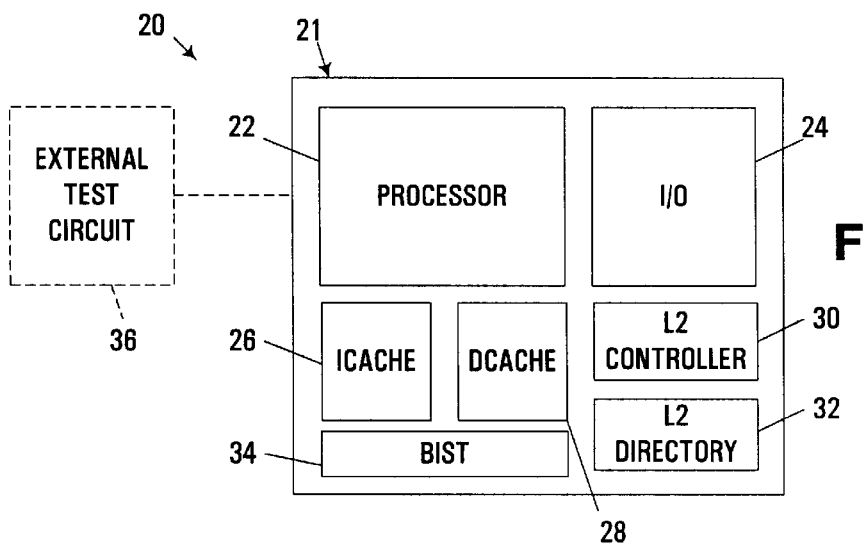
FIG. 4 is a block diagram of an apparatus incorporating memory test logic for performing stability testing consistent with the invention.

Turning to the drawings, wherein like numbers denote like parts throughout the several views, FIG. 4 illustrates an apparatus 20 suitable for performing stability testing of an SOI SRAM memory array consistent with the invention. In this implementation, stability testing of one or more embedded SRAM memory arrays in a microprocessor integrated circuit device, or chip, 21 is shown. In particular, chip 21 is shown including a processor core 22, an input/output (I/O) interface block 24, an L1 cache partitioned into an instruction cache 26 and a data cache 28, and an integrated L2 cache controller 30 and L2 directory 32, suitable for interface with one or more external memory chips to provide the data storage for the L2 cache. It is anticipated that SRAM memory arrays may be disposed in any or all of instruction cache 26 (e.g., in a data array and/or a directory array), data cache 28 (e.g., in a data array and/or a directory array), or L2 directory 32. Moreover, it is anticipated that chip 21 is fabricated using an SOI-based fabrication process known in the art.

Stability testing may be performed for any or all of the SRAM memory arrays in chip 21 using test logic disposed either on-board chip 21, e.g., using built-in self-test (BIST) logic 34, or external to chip 21, e.g., using an external test circuit 36. BIST logic 34 handles testing of all arrays on chip 21, e.g., those within caches 26 and 28 and L2 directory 32. In other embodiments, dedicated BIST logic may be incorporated into any of the functional memories on chip 21 to handle testing of just those functional memories. Furthermore, stability test operations may be initiated or performed in whole or in part by processor core 22.

Moreover, it is anticipated that stability testing may be performed during manufacture of chip 21 and/or during use of the chip, e.g., during power-on BIST occurring during a hard or soft reset of chip 21. Testing during manufacture may be performed solely in an external test circuit, i.e., without any on-board logic, or in the alternative, testing logic may be disposed on-board chip 21 to perform the testing operations and report results to the external test circuit. It will be appreciated that different testing platforms and protocols may be utilized consistent with the invention, so the invention is not limited to the particular implementation discussed herein.

Stability testing consistent with the invention typically incorporates a testing algorithm implemented in either software and/or hardware disposed in chip 21 and/or external test circuit 36. Implementation of all or part of such algorithm in software typically incorporates one or more programs comprising one or more instructions that are resident at various times in various memory and storage devices in a computer or other programmable electronic device, and that, when read and executed cause such computer or programmable electronic device to perform the steps necessary to execute steps or elements embodying the various aspects of the invention. Implementation of all or part of such algorithm in hardware typically incorporates hardwired logic and/or executable firmware defined within a circuit arrangement disposed on an integrated circuit device. While the invention has and hereinafter will be described in the context of fully functioning computers and computer systems, and/or fully functioning integrated circuit devices, those skilled in the art will appreciate that the various embodiments of the invention are capable of being distributed as a program product in a variety of forms, and that the invention applies equally regardless of the particular type of signal bearing media used to actually carry out the distribution. For software-based implementations, a program product may comprise source or executable program code. For hardware-based implementations, computer data files, referred to herein as hardware definition programs, may be used to define the layout of the circuit arrangement utilized to implement stability testing consistent with the invention. Examples of signal bearing media include but are not limited to recordable type media such as volatile and nonvolatile memory devices, floppy and other removable disks, hard disk drives, optical disks (e.g., CD-ROM's, DVD's, etc.), among others, and transmission type media such as digital and analog communication links.

Figure 5:
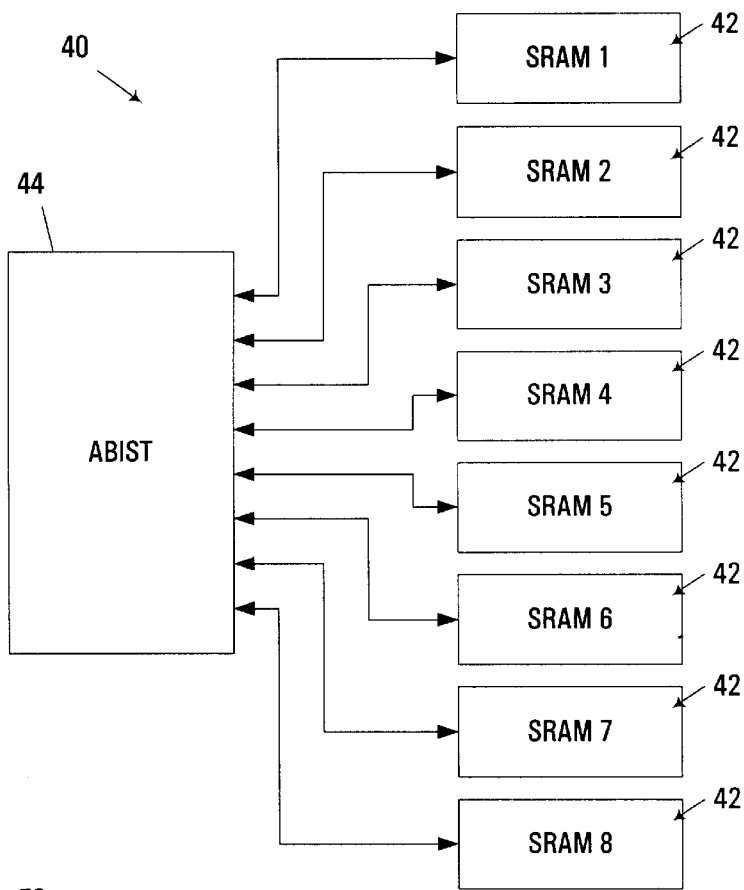
FIG. 5 is a block diagram of an embedded test logic implementation suitable for performing stability testing in the apparatus of FIG. 4.

For the sake of simplicity, the discussion hereinafter will focus on an exemplary implementation of the invention in performing a BIST-implemented stability test on an embedded memory arrays on chip 21, e.g., using BIST engine 34. However, the invention may be utilized in any other environment where it is desirable to test one or more SRAM memory cells fabricated using SOI technology. Therefore, the invention is not limited to the particular implementation disclosed herein. FIG. 5 illustrates, for example, a test apparatus 40 including a plurality of SRAM blocks 42 coupled to an array built-in self-test (ABIST) engine 44. As is well known in the art, typically a memory such as a cache memory is implemented using multiple instances of a logical subarray block, with each instance providing one bit among a plurality of bits assigned to a particular memory address. Each SRAM block 42 may therefore represent an entire memory array, or only a portion of a memory array. Only eight SRAM blocks 42 are illustrated in FIG. 5; however, it will be appreciated that any number of SRAM blocks 42 may be utilized to implement the various memory arrays embedded on chip 21.

In the illustrated implementation, ABIST engine 44 is coupled to each SRAM block 42 through a serial scan path interface, where data is scanned through a chain of scan registers in each SRAM block 42 in a manner well known in the art. In the alternative, other interfaces, e.g., parallel interfaces, may be utilized in the alternative.

Figure 6:
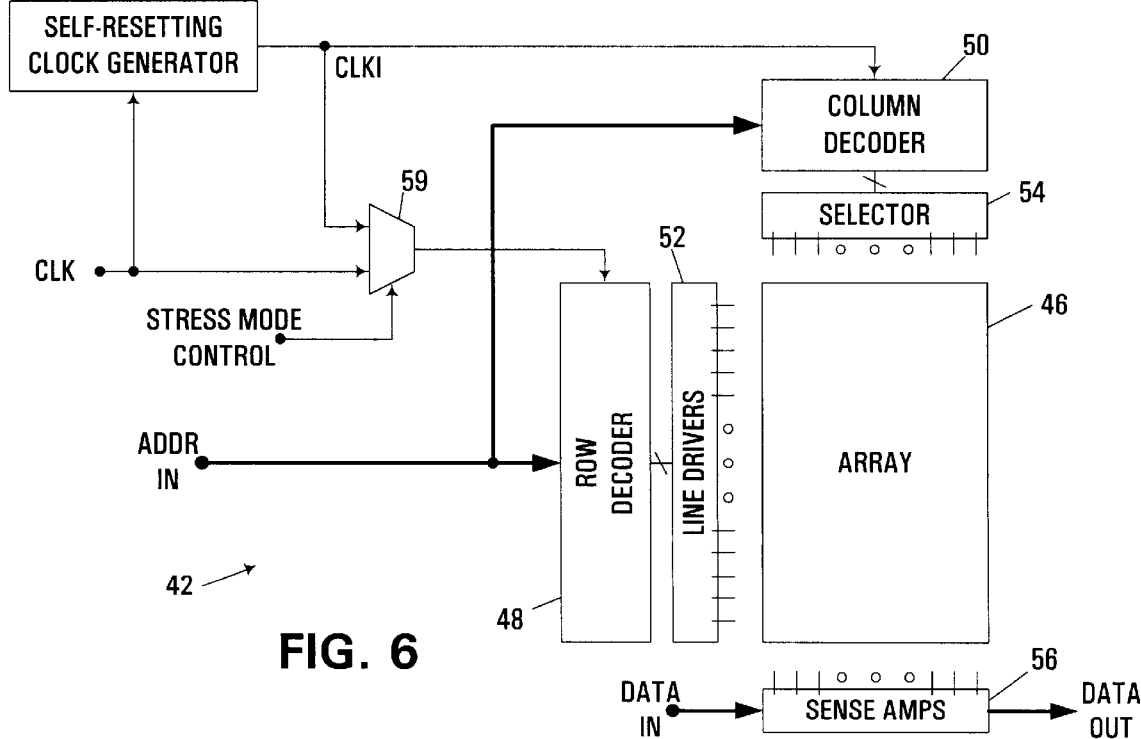
FIG. 6 is a block diagram of one of the SRAM memory blocks of FIG. 5.

FIG. 6 illustrates one of SRAM blocks 42 in greater detail, including a memory array 46 including a plurality of memory cells arranged into a plurality of rows and columns. A plurality of wordlines and a plurality of bitline pairs (not shown in FIG. 6) permit access to the plurality of memory cells in array 46. An incoming address, e.g., as provided by an address bus or by ABIST engine 44 (FIG. 5), is forwarded to a row decoder 48 and a column decoder 50 to decode a corresponding row and column for the address in a manner well known in the art. The row decoder drives one of a plurality of line drivers 52 based upon the decoded row from the memory address, with the line drivers coupled to the wordlines in array 46. Column decoder 50 drives one of a plurality of selectors 54 coupled to the bitline pairs in array 46 to selectively drive the appropriate bitline pair based upon the decoded memory address. An array of sense amplifiers 56 is also coupled to the opposite end of the bitline pairs in array 46, and is used to receive read data from a data bus, and to output data to a data bus, also in a manner well known in the art.

Figure 1:
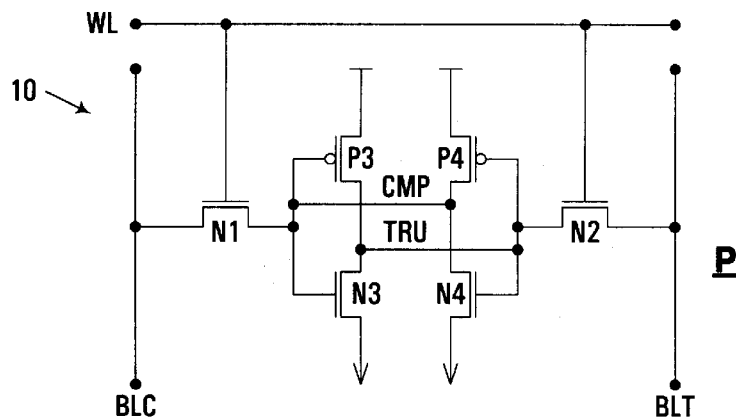
FIG. 1 is circuit diagram of a conventional static random access memory (SRAM) memory cell.
Figure 2:
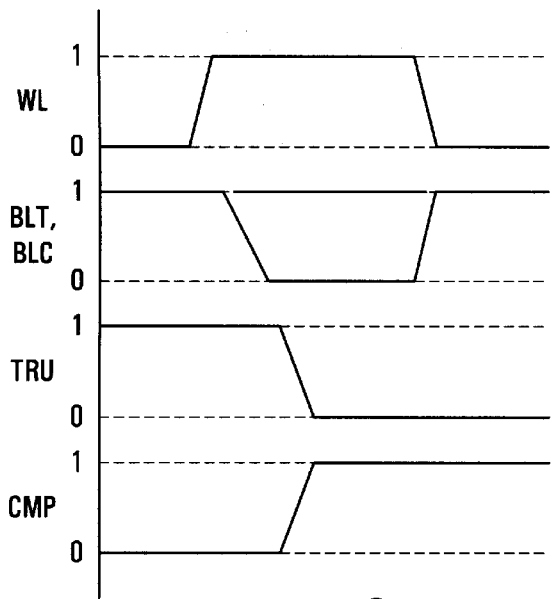
FIG. 2 is a timing diagram illustrating a write operation performed on the SRAM memory cell of FIG. 1.
Figure 3:
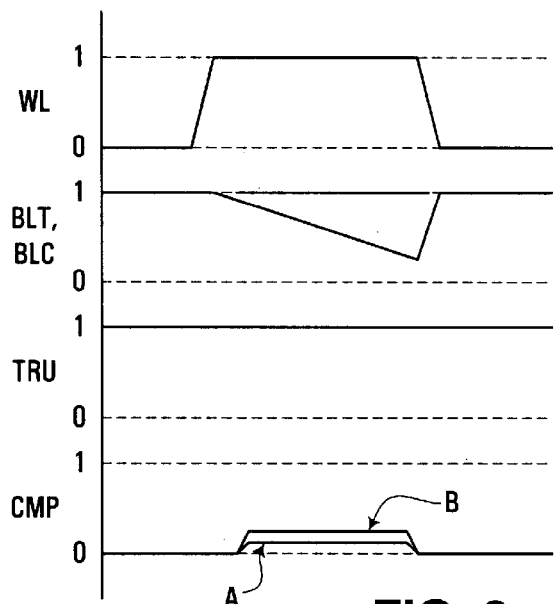
FIG. 3 is a timing diagram illustrating a read operation performed on the SRAM memory cell of FIG. 1.

Each SRAM block 42 is configured to output the appropriate wordline and bitline pair signals for array 46 to perform read and write operations on selected memory cells in the array, e.g., as discussed above in connection with FIGS. 2 and 3. It will be appreciated that the control of an SRAM memory array to perform read and write operations is well known in the art, and thus need not be discussed in greater detail herein.

As discussed above, stability testing consistent with the invention incorporates bitline precharge stress operations to stress memory cells and thereby facilitate the detection of unstable memory cells in a memory array. A bitline precharge stress operation utilizes the bitline pairs coupled to a memory cell to attempt to flood the memory cell with charge when the memory cell is at its worst case state—that is, immediately after the memory cell has been written to one state after being in the opposite state for sufficient time to introduce switching history effects to the memory cell.

Since a memory cell is typically coupled to the bitlines through pass gates controlled by a wordline, a bitline precharge stress operation consistent with the invention typically incorporates, in the least, asserting both the wordline and the bitlines coupled to a memory cell affected by switching history effects after a write operation that switches the state of the memory cell. In the illustrated implementation, concurrent assertion of the wordline and bitlines is accomplished merely by delaying the deactivation of the wordline during the write operation until some time after initiation of the bitline precharge operation that conventionally occurs at the end of an SRAM write operation.

Figure 7:
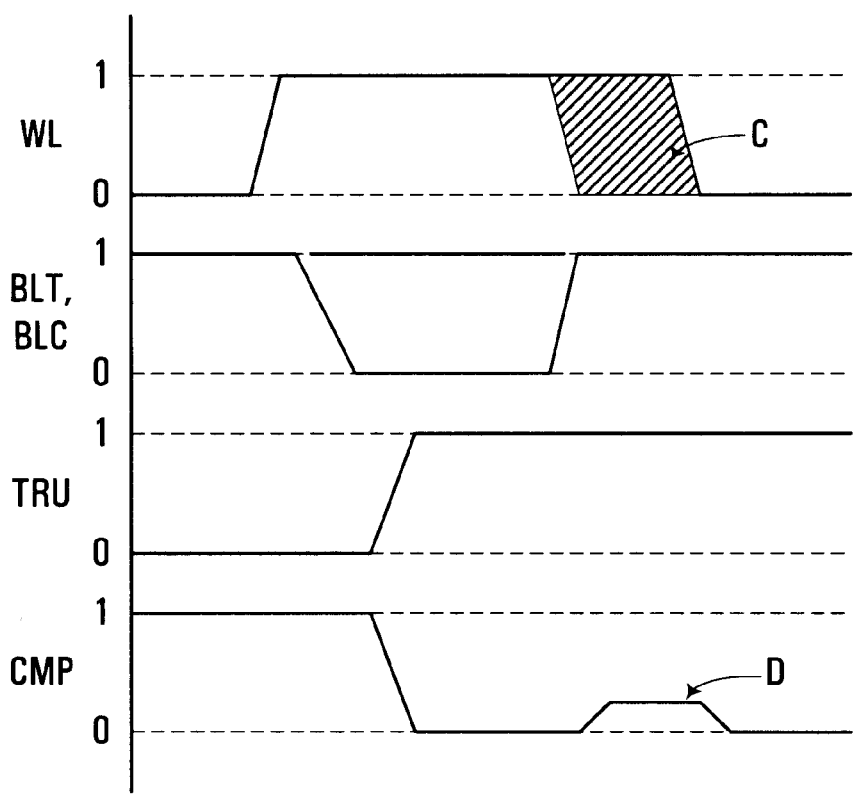
FIG. 7 is a timing diagram illustrating a write operation incorporating a bitline precharge stress operation generated by the memory array driving circuitry of FIG. 6.

For example, FIG. 7 illustrates a write operation incorporating a bitline precharge stress operation consistent with the invention. In particular, it may be seen that deassertion of the wordline is delayed the period represented at C, some time after the bitline precharge is initiated at the completion of the write operation. As a result, the pass gates in the memory cell are activated during the bitline precharge operation, and charge from the bitlines is permitted to flood into the memory cell through the pass gates. Then, based on the current state of the memory cell (e.g., the logic "1" of FIG. 7), one of the nodes of the memory cell (e.g., the CMP node in FIG. 7) is pulled to the opposite polarity (as represented at D in FIG. 7). If the body voltages of the FET's in the memory cell favor the opposite state sufficiently, and the node is pulled far enough toward the opposite polarity, the memory cell may be induced to unexpectedly switch state.

In the illustrated implementation, bitline precharge stress operations are performed in the same clock cycle as the write operation that switches the state of the memory cell. As such, implementation of these operations do not significantly impact the time required to test a memory array. Moreover, since the body voltages of FET's tend to settle based upon an exponential (RC) decay curve, stressing the memory cell during the same cycle that it is written typically introduces greater stresses than could otherwise be encountered during normal operation of a memory cell. As a result, a high degree of reliability may be ensured for memory cells that pass stability testing as described herein. In other embodiments, however, bitline precharge stress operations may not be limited to the same clock cycle as the associated write operations.

Returning to FIG. 6, implementation of bitline precharge stress operations in the illustrated implementation typically requires modification to conventional memory array driving circuitry to provide the required delay in wordline deassertion during stability testing consistent with the invention. One manner of modifying conventional circuitry, for example, is to bypass or otherwise modify any self-resetting logic utilized in generating wordline signals.

In particular, in the implementation illustrated in FIG. 6, a self-resetting clock generator 58 is utilized to generate self-resetting wordline and bitline signals by generating a self-resetting clock signal CLKI from a system clock signal CLK, in a manner well known in the art. In a self-resetting environment, the self-resetting clock signal CLKI is conventionally provided to both the row decoder 48 and the column decoder 50 to gate the generation of the wordline and bitline signals.

To implement bitline precharge stress operations consistent with the invention, a selector, e.g., a multiplexer 59, is interposed between clock generator 58 and row decoder 48, and configured to output either the self-resetting clock signal CLKI or the non-self-resetting clock signal CLK as the gate signal to the row decoder, responsive to a stress mode control signal. When in normal operational mode, the stress mode control signal is deasserted to pass the CLKI signal to the row decoder and thereby permit conventional self-resetting control. When stress testing is desired, the stress mode control signal is asserted to pass the CLK signal to the row decoder. As a result, the wordline during a write operation is asserted during the positive phase of the clock cycle, and thus subsequent to initiation of the bitline precharge operation during a write operation.

It will be appreciated by one of ordinary skill in the art having the benefit of the instant disclosure that other control logic may be utilized to generate a wordline signal that is deasserted after initiation of a bitline precharge operation. For example, for dynamic clock control systems, it may be necessary to introduce a delay line to the clock signal passed to the row decoder to delay deassertion of the wordline signal.

Figure 8:
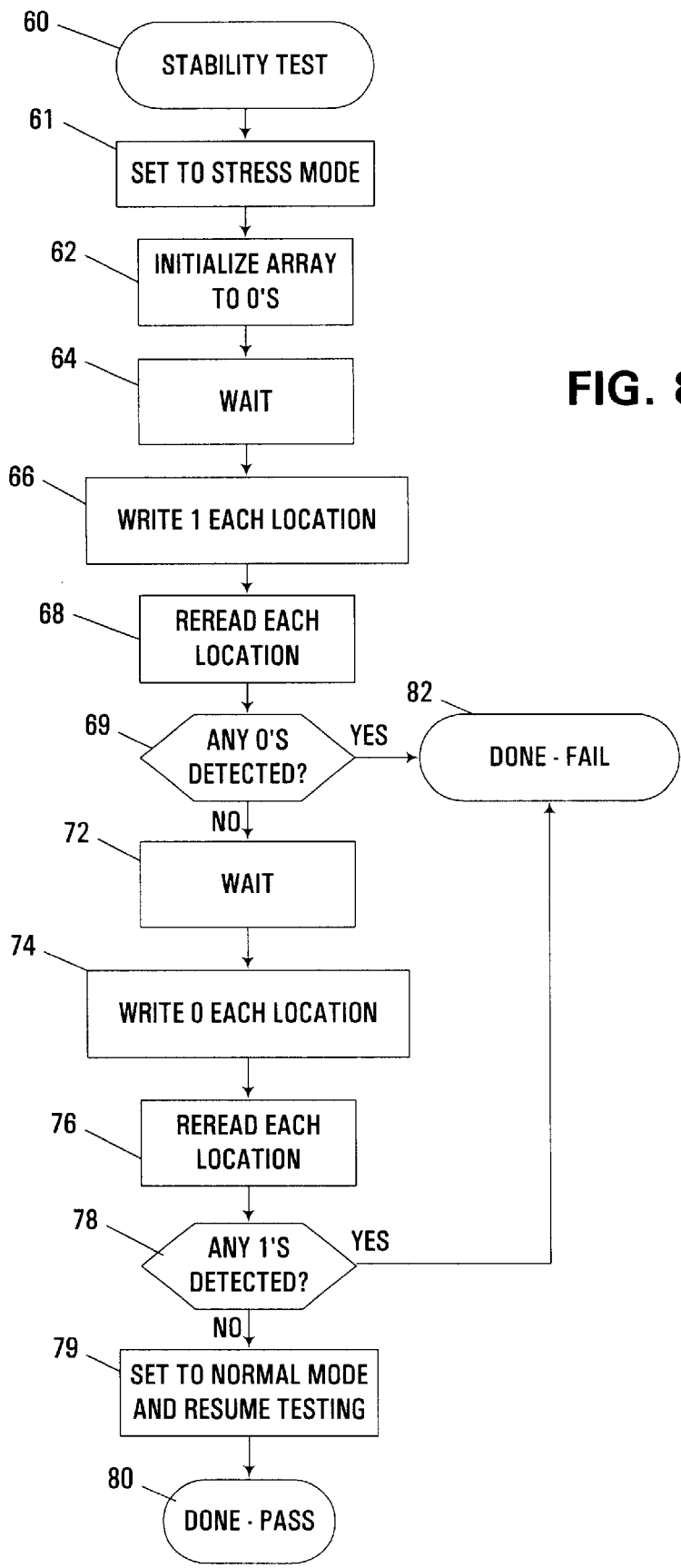
FIG. 8 is a flowchart of a stability testing algorithm performed by the embedded test logic of FIG. 5.

Returning to FIG. 5, to implement stability testing consistent with the invention, ABIST engine 44 executes a routine such as stability test routine 60 of FIG. 8. As discussed above, routine 60 may be implemented using hardwired logic within the ABIST engine, or via a software or firmware program executed by the ABIST engine.

Generally, routine 60 operates by introducing switching history effects to a memory array, and then testing the memory array by writing memory cells to their opposite states using a write operation that incorporates a bitline precharge stress operation to stress the memory cells under worst case conditions. Then, after stressing such memory cells, the states of such memory cells are determined by reading the contents thereof, with a test failure being indicated if any memory cell unexpectedly switches state as a result of the stress operation.

As such, routine 60 begins in block 61 by setting the memory array control circuitry to stress mode, e.g., by asserting the stress mode control signal that controls multiplexer 59 of FIG. 6. Next, block 62 initializes the memory array to a known state, e.g., a logic "0" state. Next, block 64 waits a time sufficient to induce adequate switching history effects.

Using the aforementioned ABIST engine 44 of the illustrated implementation, block 64 is not actually performed as a separate operation from initialization in block 62. As discussed above, ABIST engine 44 is coupled to the memory array through a serial scan chain, and thus requires several scan cycles to pass data into and out of a memory cell whenever the ABIST engine performs an operation with the memory cell. As such, initializing each memory cell in the memory array often inherently introduces sufficient delay to impose switching history effects on a memory array, so the delay may be considered to be implemented as waiting for a BIST scan operation to be completed. An advantage of such a configuration is that no additional overhead is typically added to the test.

In other embodiments, however, a timer or other counting mechanism may be required to implement block 64 to wait for a predetermined amount of time. For example, if an ABIST engine is coupled to the memory array via parallel data and address buses, no serial scan operations would be required, and thus the inherent delays associated with such operations would not be introduced during initialization. Moreover, depending upon the degree of confidence desired, the time available for performing the stability test, and the performance characteristics of the memory cells under test, the amount of time that is sufficient for inducing adequate switching history effects may vary for different applications, and thus require different amounts of delay introduced after initialization of a memory array.

Next, block 66 performs a write operation on each of the plurality of memory cells in the array to set each such memory cell to the opposite state (a logic "1"). Given that the stress mode is enabled, each such write operation also introduces a bitline precharge stress operation to a memory cell, thereby stressing the memory cell when the bitlines are precharged while the wordline, and thus the pass gates of the memory cell, are activated. Doing so permits charges to flow from the bitline pairs to flood into the memory cell, and thereby stress the memory cell as described herein.

Once each memory cell in the array is written to in such a manner, block 68 then rereads each memory cell to verify whether the memory cell still contains a logic "1" state. Next, block 69 determines whether any logic "0" states were detected, indicating that an unstable memory cell was encountered.

If not, control passes to blocks 72–74, which perform a second pass through the memory array, this time waiting for switching history effects to be introduced at the opposite polarity as in the first pass (as it is assumed that all memory cells are set to a logic "1" state as a result of block 66), and then writing a logic "0" state to each memory cell while the stress mode is enabled, such that a bitline precharge stress operation is performed on each memory cell. In the alternative, the entire array may be initialized to the logic "1" state prior to block 72.

Next, block 76 rereads each memory cell in the array to determine whether any memory cell has switched state back to the logic "1" state, and block 78 determines whether any logic "1" states were detected. If not, the stability test has been passed, and control passes to block 79 to reset the stress mode control signal to resume the normal mode of operation for the memory array. In addition, any other desired memory testing is optionally performed. Block 80 then terminates routine 60 with a "pass" indication.

If either block 69 or block 78 detects that a memory cell has switched state, control passes to block 82 to terminate routine 60 with a "fail" indication. Stability testing is then complete.

It should be noted that any delay may be present between a write operation and a reread operation on a memory cell, as it is the bitline precharge stress operation that will induce, if at all, the memory cell to switch back to its favored state. As such, an alternative implementation may be to reread each memory cell immediately after it is stressed. It is also to be noted that stability testing may be performed at the rated operational speed of a memory array, or at some lower speed.

As an example, in one exemplary embodiment where an embedded SRAM memory array is implemented using multiple (e.g., up to 48) 2 k×72 SRAM blocks rated at 500–700 MHZ, and with a scan chain requiring at least 135 scan cycles defined in each SRAM block, stability testing may be performed at 500 MHZ, thereby providing a delay between initializing the memory array and performing the access operations of about 276 microseconds, and an overall test time (for two passes) of about 1.66 milliseconds.

It will also be appreciated that the procedures described herein may be used to test individual memory cells, all the memory cells in an array, or only a portion of the memory cells in an array. In addition, any number of sequences may be used to control the order in which memory addresses are accessed in an array during a test. Furthermore, all of the memory cells in an array may be initialized to the same state, or different initial states may be used for different memory cells.

Other modifications will be apparent to one of ordinary skill in the art. Therefore, the invention lies in the claims hereinafter appended.

What is claimed is:

1. A method of testing a silicon-on-insulator (SOI) static random access memory (SRAM), the method comprising:
    (a) introducing switching history effects to an SOI SRAM memory cell by maintaining the memory cell in a first state for a period of time, the memory cell including a pair of pass gates respectively coupled to a pair of bitlines and activated by a wordline;
    (b) setting the memory cell to a second state after introducing the switching history effects;
    (c) stressing the memory cell after setting the memory cell to the second state by asserting the wordline after initiating precharging of the pair of bitlines; and
    (d) determining the current state of the memory cell after stressing the memory cell to confirm whether the memory cell is still in the second state.

2. The method of claim 1, further comprising indicating a test failure in response to determining that the current state of the memory cell is not the second state.

3. The method of claim 1, wherein maintaining the memory cell in the first state for the period of time includes:
    (a) initializing the memory cell to the first state; and
    (b) waiting a predetermined amount of time between initializing the memory cell to the first state and setting the memory cell to the second state.

4. The method of claim 3, wherein waiting the predetermined amount of time includes waiting until completion of a BIST scan operation.

5. The method of claim 3, wherein the memory cell is a first memory cell in an array of memory cells, and wherein initializing the memory cell to the first state includes initializing each memory cell in the array of memory cells to the first state, and wherein setting the memory cell to the second state and stressing the memory cell are performed for each memory cell in the array.

6. The method of claim 1, wherein setting the memory cell to the second state includes asserting the wordline, controlling the bitlines after asserting the wordline to set the memory cell, and precharging the bitlines after controlling the bitlines, and wherein stressing the memory cell comprises deasserting the wordline after initiating precharging of the bitlines such that the memory cell is stressed.

7. The method of claim 6, wherein setting the memory cell to the second state and stressing the memory cell are performed in the same memory access cycle.

8. The method of claim 6, wherein deasserting the wordline after initiating precharging of the bitlines includes bypassing a self-resetting clock generator used to control deassertion of the wordline such that a clock signal fed to the self-resetting clock generator is used to gate assertion of the wordline.

9. The method of claim 6, wherein deasserting the wordline after initiating precharging of the bitlines includes delaying deassertion of the wordline.

10. The method of claim 1, further comprising, after determining the current state of the memory cell:
    (a) introducing switching history effects in the memory cell by waiting a predetermined amount of time;
    (b) setting the memory cell to the first state after waiting the predetermined amount of time;
    (c) stressing the memory cell after setting the memory cell to the first state by asserting the wordline while precharging the pair of bitlines; and
    (d) determining the current state of the memory cell after stressing the memory cell after setting the memory cell to the first state to confirm whether the memory cell is still in the first state.

11. The method of claim 1, wherein determining the current state of the memory cell includes reading the memory cell.

12. The method of claim 1, wherein introducing the switching history effects, setting the memory cell to the second state, stressing the memory cell, and determining the current state of the memory cell are performed by a built-in self-test (BIST) engine disposed on the same integrated circuit device as the memory cell.

13. The method of claim 1, wherein introducing the switching history effects, setting the memory cell to the second state, stressing the memory cell, and determining the current state of the memory cell are performed by a memory tester disposed external to an integrated circuit device upon which the memory cell is disposed.

14. A method of testing a silicon-on-insulator (SOI) static random access memory (SRAM), the method comprising:
(a) initializing each of a plurality of memory cells in a memory array to a first state, the memory array including a plurality of wordlines and a plurality of pairs of bitlines used to access memory cells within the memory array;
(b) stressing each of the plurality of memory cells, including, for each memory cell:
(i) asserting the wordline for the memory cell;
(ii) controlling the bitlines for the memory cell after asserting the wordline to set the memory cell to a second, opposite state;
(iii) precharging the bitlines for the memory cell after controlling the bitlines; and
(iv) deasserting the wordline for the memory cell after initiating precharging of the bitlines; and
(c) after stressing each of the plurality of memory cells, determining the current state of each memory cell to confirm whether the memory cell is still in the second state for that memory cell.

15. The method of claim 14, further comprising maintaining each of the plurality of memory cells in the first state for a period of time between initializing each of the plurality of memory cells and stressing each of the plurality of memory cells to allow switching history effects to be introduced to each memory cell.

16. The method of claim 15, wherein maintaining each of the plurality of memory cells in the first state includes waiting until completion of a BIST scan operation.

17. The method of claim 14, further comprising indicating a test failure in response to determining that the current state of any of the plurality of memory cells is not the second state for such memory cell.

18. The method of claim 14, further comprising, after determining the current state of each memory cell:
(b) stressing each of the plurality of memory cells while each memory cell is still in its second state, including, for each memory cell:
(i) asserting the wordline for the memory cell;
(ii) controlling the bitlines for the memory cell after asserting the wordline to set the memory cell to the first state;
(iii) precharging the bitlines for the memory cell after controlling the bitlines; and
(iv) deasserting the wordline for the memory cell after initiating precharging of the bitlines; and
(c) thereafter determining the current state of each memory cell to confirm whether the memory cell is still in the first state for that memory cell.

19. The method of claim 14, wherein initializing each of a plurality of memory cells in a memory array to a first state includes initializing each of the plurality of memory cells to the same state.

20. The method of claim 14, wherein deasserting the wordline after initiating precharging of the bitlines includes bypassing a self-resetting clock generator used to control deassertion of the wordline such that a clock signal fed to the self-resetting clock generator is used to gate assertion of the wordline.

21. The method of claim 14, wherein deasserting the wordline after initiating precharging of the bitlines includes delaying deassertion of the wordline.

22. A method of testing a silicon-on-insulator (SOI) static random access memory (SRAM), the method comprising:
(a) initializing each memory cell in a memory array to a zero logic state, the memory array including a plurality of wordlines and a plurality of pairs of bitlines used to access memory cells within the memory array;
(b) after initializing each memory cell to the zero logic state, waiting for completion of a first BIST scan operation;
(c) stressing each memory cell in the memory array a first time by:
(i) asserting the wordline for such memory cell;
(ii) controlling the bitlines for such memory cell after asserting the wordline to set such memory cell to a one logic state;
(iii) precharging the bitlines for such memory cell after controlling the bitlines; and
(iv) deasserting the wordline for such memory cell after initiating precharging of the bitlines;
(d) after stressing each memory cell in the memory array the first time, determining the current state of each memory cell a first time to confirm whether such memory cell is still in the one logic state;
(e) after determining the current state of each memory cell the first time, waiting for completion of a second BIST scan operation;
(f) stressing each memory cell in the memory array a second time by:
(i) asserting the wordline for such memory cell;
(ii) controlling the bitlines for such memory cell after asserting the wordline to set such memory cell to the zero logic state;
(iii) precharging the bitlines for such memory cell after controlling the bitlines; and
(iv) deasserting the wordline for such memory cell after initiating precharging of the bitlines;
(g) after stressing each memory cell in the memory array the second time, determining the current state of each memory cell a second time to confirm whether such memory cell is still in the zero logic state; and
(h) indicating a test fail if, during determining the current state of each memory cell the first time, any memory cell is determined to be in the zero logic state, or if, during determining the current state of each memory cell the second time, any memory cell is determined to be in the one logic state.

23. An apparatus, comprising:
(a) a memory array including a silicon-on-insulator (SOI) static random access memory (SRAM) memory cell, the memory cell including a pair of pass gates respectively coupled to a pair of bitlines and activated by a wordline; and
(b) test logic coupled to the memory array, the test logic configured to introduce switching history effects to the memory cell by maintaining the memory cell in a first state for a period of time, set the memory cell to a second state after introducing the switching history effects, stress the memory cell after setting the memory cell to the second state by asserting the wordline after initiating precharging of the pair of bitlines, determine the current state of the memory cell after stressing the memory cell to confirm whether the memory cell is still in the second state.

24. The apparatus of claim 23, wherein the memory array and the test logic are disposed on an integrated circuit device.

25. The apparatus of claim 24, wherein the test logic comprises a built in self test (BIST) engine.

26. The apparatus of claim 23, wherein the memory array is disposed on an integrated circuit device, and wherein the test logic is disposed in an external test circuit electrically coupled to the integrated circuit device.

27. The apparatus of claim 23, further comprising a self-resetting clock generator configured to gate assertion of the wordline in response to a clock signal, wherein the test logic is further configured to assert the wordline after initiating precharging of the pair of bitlines by bypassing the self-resetting clock generator such that the clock signal is used to gate assertion of the wordline.

28. A program product, comprising:

(a) a program configured to test a silicon-on-insulator (SOI) static random access memory (SRAM) memory cell, the memory cell of the type including a pair of pass gates respectively coupled to a pair of bitlines and activated by a wordline, the program further configured to introduce switching history effects to the memory cell by maintaining the memory cell in a first state for a period of time, set the memory cell to a second state after introducing the switching history effects, stress the memory cell after setting the memory cell to the second state by asserting the wordline after initiating precharging of the pair of bitlines, determine the current state of the memory cell after stressing the memory cell to confirm whether the memory cell is still in the second state; and (b) a signal bearing medium bearing the program.

29. The program product of claim 28, wherein the signal bearing medium includes at least one of a recordable medium and a transmission medium.

30. The program product of claim 28, wherein the program defines a built in self test circuit configured to be fabricated on an integrated circuit device along with the memory cell.

31. The program product of claim 28, wherein the program is configured to be executed by an external test circuit configured to be electrically coupled to an integrated circuit device upon which the memory cell is disposed.

* * * * *